United States Patent
Hu et al.

(10) Patent No.: US 7,785,974 B2
(45) Date of Patent: Aug. 31, 2010

(54) METHODS OF EMPLOYING A THIN OXIDE MASK FOR HIGH DOSE IMPLANTS

(75) Inventors: Binghua Hu, Plano, TX (US); Yu-En Hsu, Allen, TX (US); Qingfeng Wang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 902 days.

(21) Appl. No.: 11/474,824

(22) Filed: Jun. 26, 2006

(65) Prior Publication Data

US 2007/0298579 A1    Dec. 27, 2007

(51) Int. Cl.
   *H01L 21/331* (2006.01)
(52) U.S. Cl. ............... 438/309; 438/370; 257/E21.537; 257/E21.696
(58) Field of Classification Search ................. 438/377, 438/508, 510, 514, 518, 522, 526, 301, 270, 438/279, 309, 370; 257/E21.537, E21.696
   See application file for complete search history.

(56) References Cited

U.S. PATENT DOCUMENTS

| | | | |
|---|---|---|---|
| 6,033,946 A * | 3/2000 | Hutter et al. | 438/202 |
| 6,249,030 B1 * | 6/2001 | Lee | 257/368 |
| 6,255,215 B1 | 7/2001 | Hause et al. | |
| 6,365,913 B1 | 4/2002 | Misewich et al. | |
| 6,376,897 B2 | 4/2002 | Yamada et al. | |
| 6,455,383 B1 | 9/2002 | Wu | |
| 6,699,765 B1 | 3/2004 | Shideler et al. | |
| 6,703,685 B2 | 3/2004 | Ahmed et al. | |
| 6,716,709 B1 | 4/2004 | Springer et al. | |
| 6,815,276 B2 | 11/2004 | Hower et al. | |
| 6,853,053 B1 | 2/2005 | Vashchenko et al. | |
| 6,869,851 B2 * | 3/2005 | Trogolo et al. | 438/301 |
| 6,878,999 B2 | 4/2005 | Hower et al. | |
| 6,900,101 B2 | 5/2005 | Lin | |
| 6,964,907 B1 | 11/2005 | Hopper et al. | |
| 2002/0182826 A1 * | 12/2002 | Cheng et al. | 438/433 |
| 2005/0215055 A1 | 9/2005 | Bu et al. | |

* cited by examiner

*Primary Examiner*—Khiem D Nguyen
(74) *Attorney, Agent, or Firm*—Warren L. Franz; Wade J. Brady, III; Frederick J. Telecky, Jr.

(57) ABSTRACT

A method for forming a bipolar transistor device includes providing a semiconductor substrate. An oxide layer is formed on the semiconductor substrate. The oxide layer is patterned to form an opening that exposes a portion of the semiconductor substrate. A dopant, such as antimony, is implanted into the semiconductor substrate through the opening to form a buried layer. An upper portion of the mask layer is removed to define a thin mask layer. A buried layer diffusion process is performed to drive in the implanted dopants while mitigating recess formation.

27 Claims, 4 Drawing Sheets

METHODS OF EMPLOYING A THIN OXIDE MASK FOR HIGH DOSE IMPLANTS

FIELD OF INVENTION

The present invention relates generally to semiconductor devices and more particularly relates to methods of fabricating semiconductor devices that employ a thin oxide mask for high dose implants for forming buried layers with a reduced recess.

BACKGROUND OF THE INVENTION

Bipolar transistors also referred to as bipolar junction transistors (BJT) are transistor devices commonly employed with other circuit elements for voltage gain, current gain, or signal power gain. Bipolar transistors are semiconductor devices in which both electrons and holes participate in the conduction process. Some example uses for bipolar transistors include high speed circuits, analog circuits, and power applications.

One example of integration of bipolar transistors with complementary metal oxide semiconductor technology is referred to as bipolar complementary metal oxide semiconductor (BiCMOS) technology, which is an integrated circuit technology that combines bipolar devices with CMOS to yield integrated circuit devices that can have reduced noise, improved linearity, device matching, and high drive capacity, and permit improved performance. BiCMOS integrated circuits have bipolar and MOS transistors formed on the same semiconductor body or substrate. One advantage of such devices is that they combine the high power and fast switching speeds of bipolar devices with the high density and low power consumption of MOS transistors. The diversity of uses for such BiCMOS devices has fueled a surge toward fabricating faster, denser and more powerful integrated BiCMOS devices by more individual device enhancing manufacturing processes.

Bipolar junction transistors consist of three differently doped semiconductor regions, an emitter region, a base region and a collector region. In operation, current flows between the emitter and the collector according to relatively small changes in the voltage applied across the base-emitter regions. Bipolar transistors differ from other types of transistors in that electrode contacts are typically located at a single top or upper surface of devices. As a result, isolation regions can be required in order to isolate devices and permit proper operation of bipolar devices without interference from surrounding devices.

In order to reduce series resistance of the collector, a buried layer, generally n-type, is present and is located below base, emitter, and collector regions of fabricated bipolar transistor devices. Heavy doped buried layer gives better isolation to substrate which is widely used in BiCMOS technology. Conventional fabrication techniques for forming buried layers generally form a thick hard mask and then implant a selected dopant. Then, a drive in or diffusion process is performed to diffuse the implanted dopants. However, the conventional buried layer fabrication techniques typically consume a relatively large amount of underlying silicon. As a result, a silicon recess is generally formed that can be problematic for subsequent fabrication processes, limit the types of isolation regions employed, and/or hamper formation of isolation regions.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

Aspects of the present invention facilitate bipolar junction device and BiCMOS fabrication by mitigating silicon recess formation during buried layer formation. As a result, isolation regions such as shallow trench isolation (STI) regions can be employed. The aspects employ a relatively thin oxide or mask instead of a thick oxide during a drive in portion of buried layer formation. The use of the relatively thin oxide hard mask mitigates silicon recess formation, which solves the issue of remaining nitride blocking Moat and makes STI integration possible for power process.

In accordance with one aspect of the invention, a method for fabricating a bipolar transistor device is provided. A semiconductor substrate is provided. An oxide layer is formed on the semiconductor substrate. The oxide layer is patterned to form an opening that exposes a portion of the semiconductor substrate. Dopants are implanted into the semiconductor substrate through the opening to form a buried layer. A portion of the oxide layer is removed to define a thin oxide layer. A buried layer diffusion process is performed to drive in the implanted dopants. Other methods are disclosed.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, known structures and devices are shown in block diagram form in order to facilitate describing one or more aspects of the present invention.

Aspects of the present invention facilitate bipolar junction device fabrication by mitigating silicon recess formation during buried layer formation. As a result, isolation regions such as shallow trench isolation (STI) regions can be employed. The aspects employ a relatively thin oxide or mask instead of a thick oxide during a drive in portion of buried layer formation. The use of the relatively thin oxide hard mask mitigates silicon recess formation, which solves the problem of GOI failure or blocking Moat due to nitride residue on the regions with Si recess after STI CMP process and reduces variations of STI step height across the wafer or devices.

Conventionally, buried layers of bipolar transistors can be formed by growing a thick oxide layer of about 7500 Angstroms over a substrate. A window or opening is then formed in the thick oxide layer and a selected dopant is implanted into the opening. Subsequently, a drive in process is performed that causes the implanted dopant to diffuse and thereby form a buried layer. The thick oxide is removed and an epitaxial layer is then deposited or formed over the buried layer.

However, the conventional drive in process in combination with the thick oxide layer forms a relatively deep recess, such as, for example about 800 Angstroms. The thick oxide mask will suppress oxidation on undoped regions while enhanced oxidation occurs in the opening due to heavy n-type doping, therefore a deep Si recess is created. The deep recess can prevent or hamper shallow trench isolation (STI) region formation because overpolish is required to remove STI oxide on the top of Moat nitride in the Si recess region which could damage an isolated moat in worst case. One conventional approach to mitigate silicon recess formation is to employ a photoresist as an implant mask instead of a hard mask, such as an oxide. However, so doing is problematic. A dedicated clean hood is needed to strip photoresist without cross-contamination. A sufficient screen oxide may not be present during drive in. Also, no mechanism exists to properly strip damaged screen oxide after implanting with a dopant such as Antimony (Sb), yet keep the oxide under the photoresist untouched. Unremoved screen oxide can be a nucleation source of epitaxial layer stacking faults.

Figure 1:
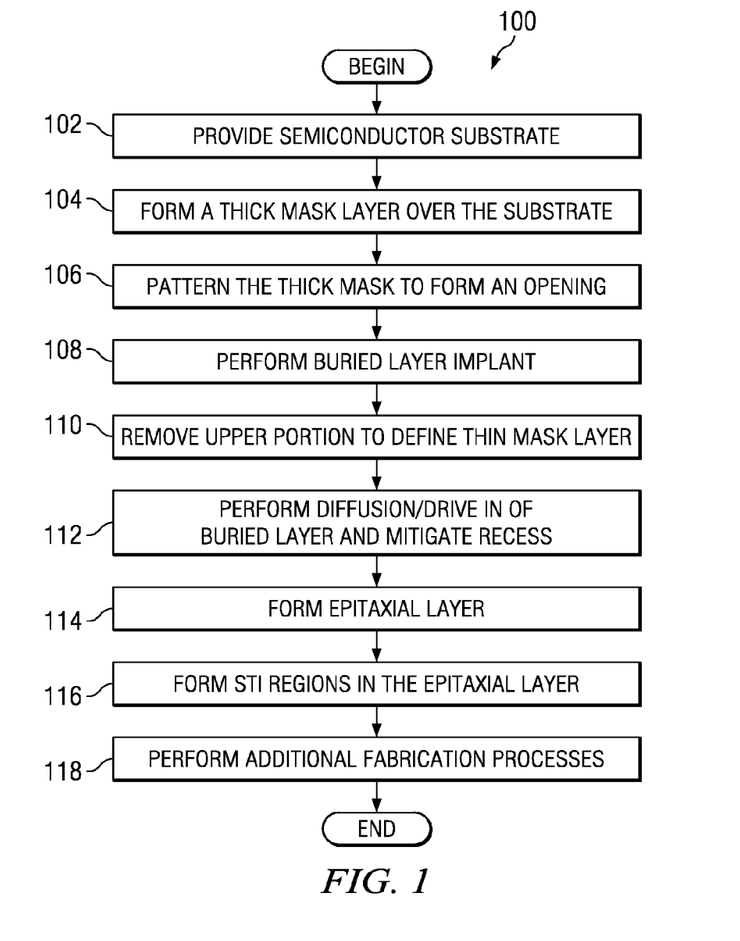
FIG. 1 is a flow diagram illustrating a method of fabricating a bipolar transistor device in accordance with an aspect of the present invention.

FIG. 1 is a flow diagram illustrating a method 100 of fabricating a bipolar transistor device in accordance with an aspect of the present invention. The method mitigates silicon recess formation during buried layer formation of the bipolar transistor device.

The method 100 begins at block 102, wherein a semiconductor substrate is provided. The substrate is comprised of a semiconductor material and can include one or more layers. The substrate can be lightly doped with a p-type dopant in one example. In another example, the substrate is comprised of an epitaxial p-type layer.

An oxide mask layer is formed over the semiconductor substrate at block 104. The oxide mask layer has a suitable thickness, for example, about 1300 Angstroms in one example. Other examples of suitable thicknesses include a range of about 1000 Angstroms to about 2000 Angstroms. However, the oxide mask layer is thinner than conventional hard oxide masks, which are generally about 7500 Angstroms thick.

The oxide mask layer is comprised of a suitable mask material that facilitates implantation of selected dopants. In one example, the oxide mask layer is comprised of thermally grown silicon dioxide and/or deposited silicon dioxide.

The oxide mask layer is patterned at block 106 to form an opening and expose a selected portion of the semiconductor substrate. In one example, the opening is formed by employing photoresist to expose selected portions of the oxide mask layer and then selectively etch the oxide mask layer. Afterwards, the remaining photoresist is removed. It is appreciated that other suitable patterning processes can be employed.

A buried layer implant is performed at block 108 in order to implant a selected dopant and form a buried layer. The selected dopant is implanted through the opening of the oxide mask layer and into selected regions of the semiconductor substrate. Typically, the dopant is implanted with a relatively high dose. In one example, the selected dopant is antimony (Sb), which is an n-type dopant. Sb is a relatively heavy, large atom compared to other n-type dopants and requires long time drive at high temperature which is one of the reasons a thick oxide mask was needed in conventional power process to prevent Sb diffusing through an oxide mask. Continuing the example, the Sb is implanted with a dose of 3.0E15 atoms/cm$^2$ and an energy of 60 KeV with the oxide mask layer having a thickness of about 1300 Angstroms. However, other n-type and p-type dopants can also be employed.

An upper portion of the oxide mask layer is removed at block 110 to define a thin oxide mask layer. The upper portion is removed after forming the opening and implanting the selected dopant. In one example, for an oxide mask of about 1300 Angstroms, the removed upper portion is about 800 Angstroms thick which leaves a remaining portion, the thin mask layer, with a thickness of about 500 Angstroms. The upper portion of screen oxide is removed, in one example, with the injection of fresh 0.49% diluted HF into the process chamber for 280 seconds in 30 degree Celsius ambient. After the HF etch, SC2 solution is injected into the chamber to remove metallic contaminants on the surface. Then the wafers are rinsed with deionized water (DIW and dried with isopropyl alcohol (IPA) vapor to prevent water spotting on the wafer surface. Other suitable techniques can also be employed to remove the upper portion. Other examples of suitable remaining oxide thicknesses include those within a range of about 200 Angstroms to about 800 Angstroms. It is appreciated that other suitable thicknesses for the thin mask layer are contemplated.

A thermal drive-in/diffusion process is performed at block 112 to continue forming the buried layer. The thermal process causes silicon dioxide to grow over the buried layer and the thin mask layer. Typically, a minimum amount of oxygen flow is employed during the thermal drive-in process in order to mitigate recess formation. In one example, oxygen flow of about 0.3 percent is employed to yield suitable drive in for the buried layer and result in a recess of less than about 100 Angstroms. In contrast, a conventional thermal drive with 100% of oxygen flow in process results in a silicon recess more than 800 Angstroms. An example of a suitable thermal drive-in process for implanted Sb is performed at a temperature of about 1200 C with about 0.3 percent oxygen. A second buried layer of opposite conductivity can also be formed over a portion of the buried layer in some aspects of the invention.

In one example, the drive in process is performed for 150 minutes at about 550 degrees Celsius with a nitrogen ($N_2$) flow, for 150 minutes at about 550 degrees Celsius to about 1200 degree Celsius with an oxygen flow of about 0.3 percent, for 80 minutes at about 1200 degrees Celsius with an oxygen flow of about 0.3 percent, and for 210 minutes at about 1200 degrees Celsius to about 600 degrees Celsius. For such a drive-in process, the thermal grown oxide obtains a thickness of about 300 Angstroms, in this example, yielding a recess, such as shown below in FIG. 2H at 216, of less than about 100 Angstroms from un-doped region.

An epitaxial layer is formed over whole wafer including the buried layer at block 114. A suitable epitaxial growth process is employed to form the epitaxial layer to a selected thickness. In one example, the epitaxial layer is formed or subsequently doped with a p-type dopant. The thin oxide mask layer can also be removed by an oxide strip or etch process.

Shallow trench isolation (STI) regions are then formed in the epitaxial layer at block 116. In one example, the STI regions are formed by growing a thin thermal oxide and deposit a thick nitride layer. Then, photo pattern and trench etch are performed to form the trenches, which are then filled with oxide via a plasma chemical vapor deposition fill. Subsequently, a planarization process, such as a chemical mechanical planarization process (CMP), is performed to remove the oxide fill material on the top of nitride which is the area to build active device and the nitride layer is then removed/stripped.

The method 100 continues at block 118 wherein fabrication of the device continues and can be completed. In one example, a deep well region is formed within the epitaxial layer above the buried layer. A deep collector region is also formed in the epitaxial layer and in contact with the buried layer. After STI process, shallow wells are formed within the deep well and base and emitter regions/electrodes are formed within the shallow wells. A collector region/electrode is formed within the deep collector region.

It is appreciated that the bipolar device can be fabricated in conjunction with CMOS devices as a BiCMOS process. For example, the base, emitter, and collector regions can be formed via the same implantation process employed to form wells and source/drain regions of a CMOS device.

It is noted that although the method 100 is shown in an illustrated order, portions of the method 100 can be performed in suitable orderings different than that described and illustrated above. Furthermore, it is appreciated that other portions of the detailed description, including subsequent figures, can be referenced to facilitate in understanding and describing the method 100.

FIGS. 2A to 2H depict stages of fabrication for a bipolar transistor or BiCMOS device in accordance with an aspect of the present invention. The device can be fabricated via the method 100 and/or variations thereof. The device is fabricated with a n-type buried layer that is formed with a relatively small recess compared with conventional fabrication techniques.

Figure 2A:
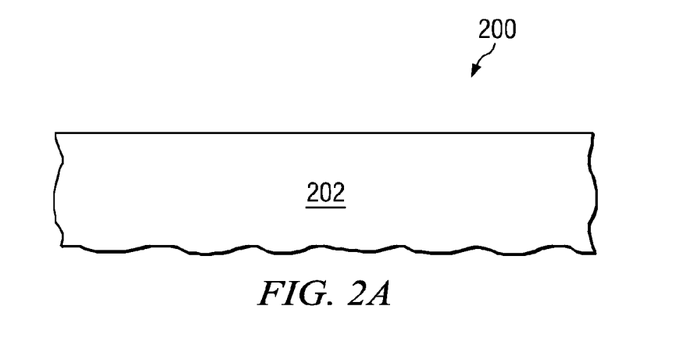
FIG. 2A is a cross sectional view depicting a stage of fabrication of a semiconductor device in accordance with an aspect of the present invention.

FIG. 2A is a cross sectional view depicting a stage of fabrication of a semiconductor device 200 in accordance with an aspect of the present invention. At this stage, a semiconductor substrate or body 202 is provided. The substrate 202 is comprised of a semiconductor material and is lightly doped p-type. The substrate 202 can be a wafer and/or an epitaxial grown layer on a wafer.

Figure 2B:
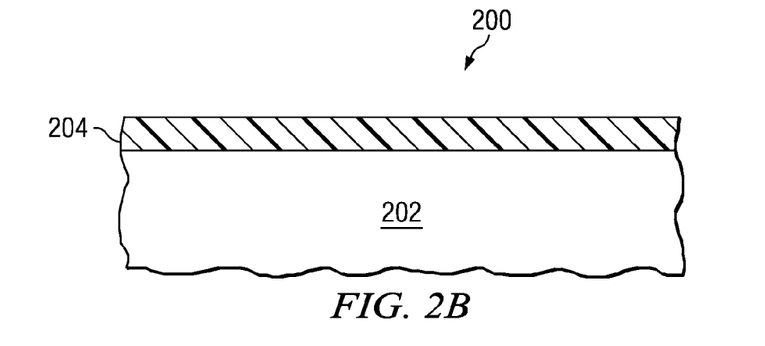
FIG. 2B is another cross sectional view illustrating a stage of fabrication of the semiconductor device in accordance with an aspect of the present invention.

FIG. 2B is another cross sectional view illustrating a stage of fabrication of the semiconductor device 200 in accordance with an aspect of the present invention. A oxide layer 204 is formed or grown on the semiconductor substrate 202. The oxide layer 204 is a hard mask layer. In one example, the oxide layer 204 has a thickness of about 1300 Angstroms, however other suitable thicknesses can be employed. However, the oxide layer 204 is substantially less thick than conventional thick oxide layers employed in buried layer formation, which are typically at about 7500 Angstroms thick.

Figure 2C:
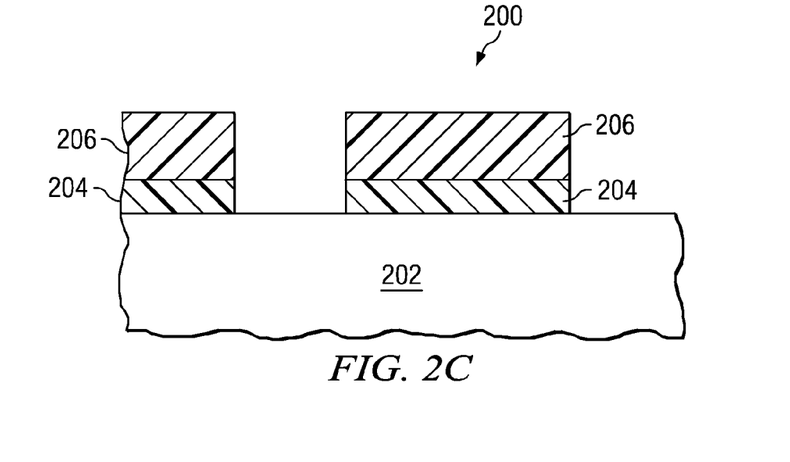
FIG. 2C is yet another cross sectional view illustrating a stage of fabrication of the semiconductor device in accordance with an aspect of the present invention.

FIG. 2C is yet another cross sectional view illustrating a stage of fabrication of the semiconductor device 200 in accordance with an aspect of the present invention. A layer of photoresist 206 is formed on the oxide layer 204 and developed to expose selected portions of the thick oxide layer 204. The oxide layer 204 is then selectively etched by using wet etch with the layer of photoresist 206 as a mask. As etched, the oxide layer 204 has openings that selectively expose target buried layer regions.

Figure 2D:
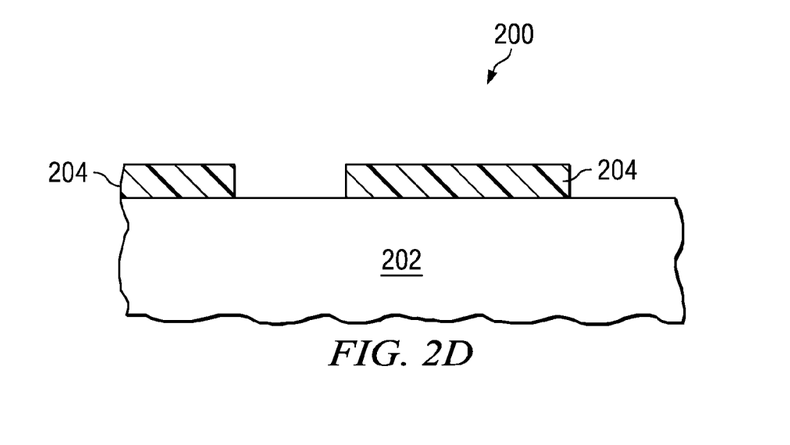
FIG. 2D is another cross sectional view illustrating a stage of fabrication of the semiconductor device in accordance with an aspect of the present invention.

FIG. 2D is another cross sectional view illustrating a stage of fabrication of the semiconductor device 200 in accordance with an aspect of the present invention. Once the openings have been formed in the thick oxide layer 204, the layer of photoresist 206 is removed. In one example, an ash process is employed to remove the photoresist.

The oxide layer 204 with the openings formed therein can operate as a hard mask for implantation processes.

Figure 2E:
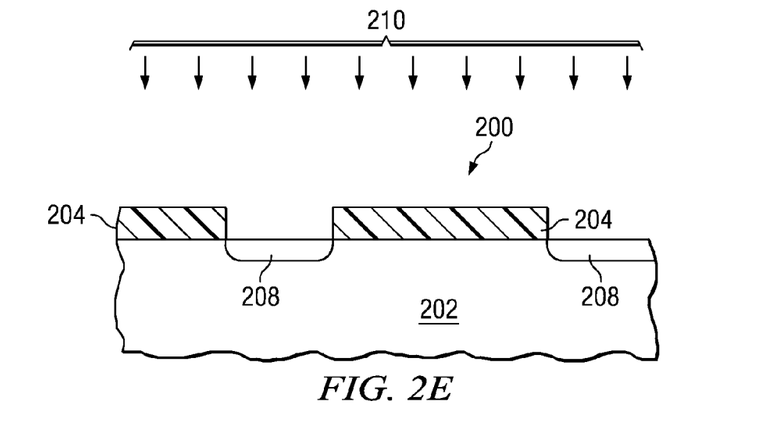
FIG. 2E is yet another cross sectional view illustrating a stage of fabrication of the semiconductor device in accordance with an aspect of the present invention.

FIG. 2E is yet another cross sectional view illustrating a stage of fabrication of the semiconductor device 200 in accordance with an aspect of the present invention. Here, ion implantation is performed wherein the thick oxide layer 204 is employed as a mask.

Buried layers 208 are formed in the semiconductor substrate 202 by performing an ion implantation process 210. Openings in the oxide layer 204 permit elected dopant(s) to pass there through and into the target regions of the semiconductor substrate 202. The dopant is implanted into the substrate 202 and thereby forms the buried layers 208.

The ion implantation process 210, in this example, implants Sb at a dose of 3E15 atoms/$cm^2$ at an energy of 60 keV for a selected duration to form n-type buried layers 208. However, it is appreciated that other suitable ion implantation processes can be employed with varied doses and energies.

Figure 2F:
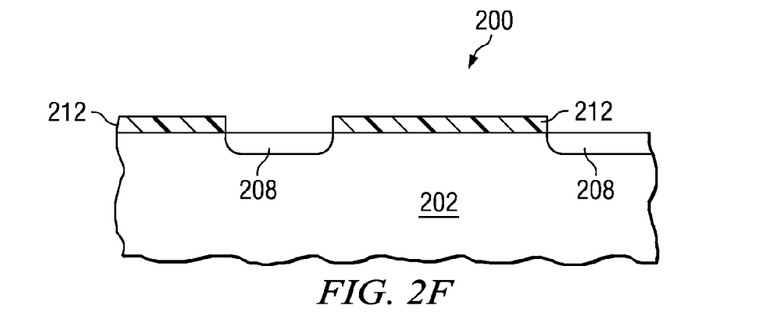
FIG. 2F is another cross sectional view illustrating a stage of fabrication of the semiconductor device in accordance with an aspect of the present invention.

FIG. 2F is another cross sectional view illustrating a stage of fabrication of the semiconductor device 200 in accordance with an aspect of the present invention. An oxide stripping process is performed that removes an upper portion of the oxide layer 204 to form a thin oxide layer 212. The thin oxide layer 212 is comprised of remaining oxide from the thicker oxide layer. The upper portion removed by the stripping process is typically a substantial amount. In one example, the upper portion removed from a 1300 Angstrom thick oxide layer 204 is about 800 Angstroms. As a result, for this example, the thin oxide layer 212 is about 500 Angstroms in thickness.

Figure 2G:
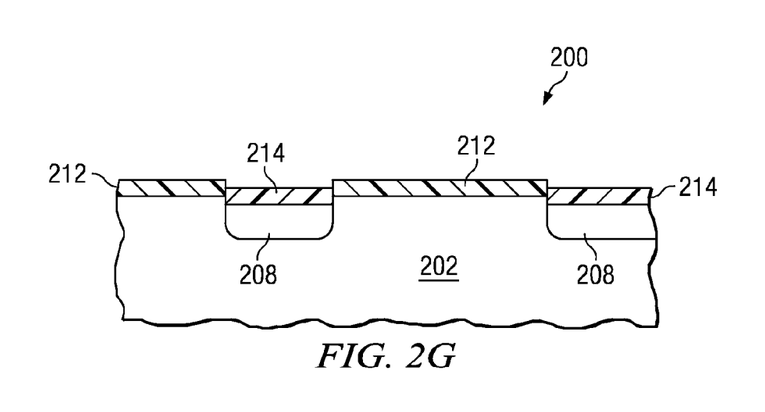
FIG. 2G is yet another cross sectional view illustrating a stage of fabrication of the semiconductor device in accordance with an aspect of the present invention.

FIG. 2G is yet another cross sectional view illustrating a stage of fabrication of the semiconductor device 200 in accordance with an aspect of the present invention. A thermal drive-in or diffusion process is performed that anneal out implant damage and diffuses the implanted dopants towards substrate and further forms the buried layers 208. The drive-in process is performed at a suitable temperature, such as about 1200 degrees Celsius and with a flow of nitrogen (N2) and low percent oxygen. In one example, the flow of oxygen is at about 0.3 percent.

During the thermal dive-in process, a thermal oxide layer 214 grows from an upper surface of the buried layers 208. The low percent oxygen, for example 0.3 percent, along with the nitrogen mitigates recess formation. This facilitates subsequent processing and permits forming and employing shallow trench isolation regions and moat regions.

In one example, the drive in process is performed for 150 minutes at about 550 degrees Celsius with a nitrogen ($N_2$) flow, for 150 minutes at about 550 degrees to about 1200 degree Celsius with an oxygen flow of about 0.3 percent, for 80 minutes at about 1200 degrees Celsius with an oxygen flow of about 0.3 percent, and for 210 minutes at about 1200 degrees Celsius to about 600 degrees Celsius. For such a drive-in process, the thermal grown oxide obtains a thickness of about 300 Angstroms, in this example, yielding a recess of less than about 100 Angstroms from un-doped region.

Figure 2H:
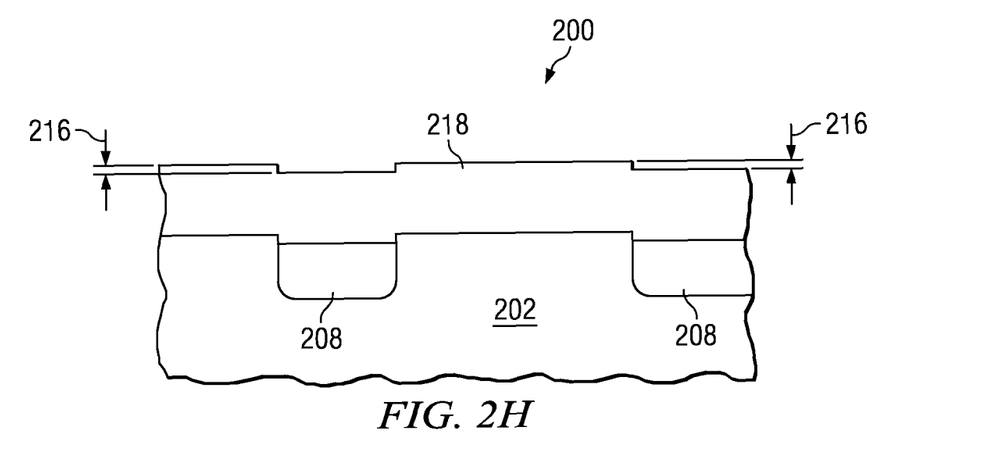
FIG. 2H is another cross sectional view illustrating a stage of fabrication of the semiconductor device in accordance with an aspect of the present invention.

FIG. 2H is another cross sectional view illustrating a stage of fabrication of the semiconductor device 200 in accordance with an aspect of the present invention. The thin oxide layer 212 and 214 are removed and an epitaxial layer 218 is formed over the device 200. A suitable epitaxial growth process can be employed to form the epitaxial layer to a selected thickness. In one example, the epitaxial layer is formed or subsequently doped with a p-type dopant.

A relatively small recess 216 is shown in the epitaxial layer 218. The recess 216 is small enough that shallow trench isolation (STI) formation can proceed without the problem of GOI failure or blocking Moat due to nitride residue on the regions with Si recess after STI CMP process and reduces variations of STI step height across the wafer or devices.

Although not shown, STI regions can be formed by depositing a pad oxide and nitride layer over the epitaxial layer 218, selectively etching trenches into the epitaxial layer 218 through the nitride layer, selectively filling the trenches with an oxide fill material, performing a planarization process to remove excess fill material, and removing the nitride layer.

It is appreciated that the views shown in FIGS. 2A to 2H are provided as an example to further illustrate aspects of the present invention and are not intended to limit the invention. Additionally, dimensions shown in the views are for illustrative purposes. It is further appreciated that alternate structures and compositions can be fabricated in accordance with the present invention.

Figure 3:
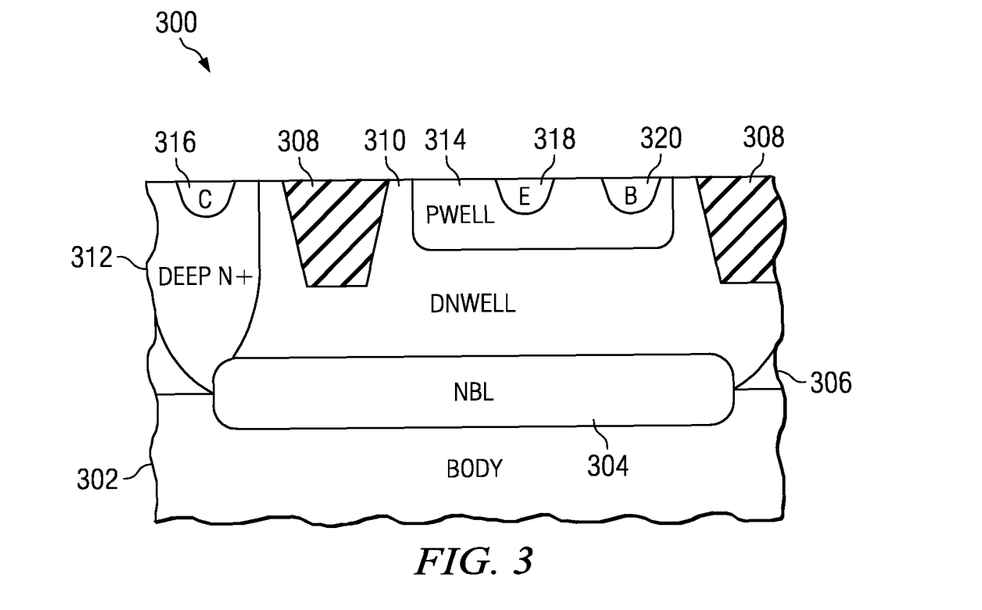
FIG. 3 is a cross sectional view illustrating a fabricated bipolar transistor device in accordance with an aspect of the present invention.

FIG. 3 is a cross sectional view illustrating a fabricated bipolar transistor device 300 in accordance with an aspect of the present invention. The device 300 is provided as an example and can be a portion or integrated with a BiCMOS device. The method 100 as well as suitable variations thereof can be employed to fabricate the device 300.

The device 300 includes a semiconductor substrate or body 302, which can be, for example, lightly p-doped silicon. An n-type buried layer 304 is formed in the substrate 302 with a thin mask layer, such as described above, during a drive-in or diffusion process in order to mitigate recess formation. An epitaxial layer 306 is formed above the substrate 302.

Shallow trench isolation regions 308 are formed in the epitaxial layer 306 in order to isolate individual devices and, in this example, to isolate the collector. Conventionally, shallow trench isolation regions 308 could not feasibly be employed because of the conventional deep recess formation obtain in conventional buried layer formation. A relatively small recess is present, such as the recess 216 shown in FIG. 2H, however the size of the recess is small enough to mitigate the problem of GOI failure or blocking Moat due to nitride residue on the regions with Si recess after STI CMP process and reduces variations of STI step height across the wafer or devices. As stated above, conventional buried layer formation processes resulted in substantial recesses and prohibited or discouraged employment of STI regions.

A deep well region 310 is formed within the epitaxial layer 306. A deep collector region 312 is formed along an edge of the deep well region and in contact with the buried layer 304. A selective n-type dopant implant is performed to form the deep collector region. It is noted that the deep collector region 312 can be formed before or after formation of the deep well region 310.

A base region 314 is formed with shallow well or dedicated implant within the deep well region 310 and has opposite type conductivity to that of the deep well region. The shallow well region 314 is separated from the deep collector region 312 by one of the isolation regions 308, in this example. A collector electrode/region 316 is formed in the deep collector 312. An emitter electrode/region 318 is formed in the shallow well 314 and a base electrode 320 is also formed in the shallow well 314.

Subsequently, other fabrication processes, such as interlayer dielectric layers, metallization layers, and the like can be performed.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A method of fabricating a semiconductor device, the method comprising:

providing a semiconductor substrate;

forming an oxide mask layer on the semiconductor substrate, the oxide mask layer comprising a thickness of oxide material;

selectively etching the oxide mask layer to form an opening exposing a portion of the semiconductor substrate;

implanting a dopant into the semiconductor substrate through the opening to form a buried layer;

removing an upper portion of the oxide mask layer to reduce the thickness of the oxide material of the oxide mask layer;

performing a thermal process to diffuse the implanted dopant and to thermally grow oxide within the opening;

forming an epitaxial layer over the semiconductor substrate including over the thermally grown oxide within the opening; and forming shallow trench isolation regions in the epitaxial layer.

2. The method of claim 1, wherein implanting the dopant comprises implanting antimony.

3. The method of claim 1, wherein the semiconductor substrate comprises silicon; and selectively etching the oxide mask layer comprises performing a wet etch.

4. The method of claim 1, wherein the oxide material of the oxide mask layer comprises silicon dioxide.

5. The method of claim 1, wherein forming the oxide mask layer comprises forming the oxide mask layer with the thickness of the oxide material being about 1300 Angstroms.

6. The method of claim 5, wherein removing the upper portion of the oxide mask layer reduces the thickness of the oxide material to about 500 Angstroms.

7. The method of claim 1, wherein the semiconductor device comprises a bipolar transistor including the buried layer, and the method further comprises:
forming a deep well region within the epitaxial layer;
forming a deep collector region within the epitaxial layer and in contact with the buried layer; and
forming a shallow well region within the deep well region.

8. The method of claim 1, wherein performing the thermal process comprises performing the thermal process with a flow of about 0.3 percent oxygen.

9. A method of fabricating a semiconductor device, the method comprising:
providing a semiconductor substrate;
forming an oxide mask layer on the semiconductor substrate; the mask layer comprising a thickness of oxide material;
selectively etching the oxide mask layer to form an opening exposing a portion of the semiconductor substrate;
implanting a dopant into the semiconductor substrate through the opening to form a buried layer of a first conductivity type;
removing an upper portion of the oxide mask layer to reduce the thickness of the oxide material in the oxide mask layer;
following removal of the upper portion, performing a thermal process to diffuse the implanted dopant and to thermally grow oxide within the opening to a thickness that differs by less than about 100 Angstroms from the thickness of the oxide material in the oxide mask layer following the thermal process;
forming an epitaxial layer over the semiconductor substrate including over the thermally grown oxide within the opening; and
forming shallow trench isolation regions in the epitaxial layer.

10. The method of claim 9, wherein forming the shallow trench isolation regions comprises:
depositing a pad oxide and nitride layer over the epitaxial layer;
selectively etching trenches into the epitaxial layer through the nitride layer;
selectively filling the trenches with an oxide fill material;
performing a planarization process to remove excess fill material; and
removing the nitride layer.

11. The method of claim 9, wherein the thermal process is performed at a temperature about 1200 degrees Celsius with an oxygen flow rate of about 0.3 percent for about 80 minutes.

12. The method of claim 9, wherein implanting the dopant comprises implanting antimony with a dose of 3.0E15 atoms/$cm^2$ and with an energy of 60 KeV.

13. The method of claim 9, further comprising:
forming a deep well region of the first conductivity type in the epitaxial layer;
forming a deep collector region of the first conductivity type in the epitaxial layer and in contact with the buried layer;
forming a shallow well region of a second conductivity type in the deep well region;
forming a collector region in the deep collector region; and
forming base and emitter regions in the shallow well region;
wherein forming the shallow trench isolation regions comprises forming a shallow trench isolation region between the deep well and deep collector regions.

14. The method of claim 13, wherein the first conductivity type is n-type conductivity.

15. The method of claim 14, wherein forming the epitaxial layer comprises forming a p-doped epitaxial layer.

16. The method of claim 13, wherein selectively etching the oxide mask layer comprises a wet etch.

17. The method of claim 14, wherein implanting the dopant comprises implanting antimony.

18. The method of claim 17, wherein forming the oxide mask layer comprises forming the oxide mask layer with a thickness of silicon dioxide of about 1000 Angstroms or more; and removing the upper portion of the oxide mask layer reduces the thickness of the silicon dioxide to a thickness of about 800 Angstroms or less.

19. The method of claim 18, wherein removing the upper portion of the oxide mask layer further comprises removing the upper portion with diluted HF.

20. A method of fabricating a semiconductor device, the method comprising:
providing a semiconductor substrate;
forming an oxide mask layer on a semiconductor substrate; the oxide mask layer comprising a thickness of silicon dioxide of about 1000 to about 2000 Angstroms;
selectively etching the oxide mask layer to form an opening exposing a portion of the semiconductor substrate;
implanting a dopant comprising antimony into the semiconductor substrate through the opening to form a buried layer;
removing an upper portion of the oxide mask layer to reduce the thickness of the silicon dioxide in the oxide mask layer to a thickness of about 200 to about 800 Angstroms;
following removal of the upper portion, performing a thermal process to diffuse the implanted dopant and thermally grow oxide within the opening to a thickness that differs by less than about 100 Angstroms from the thickness of the silicon dioxide in the oxide mask layer following the thermal process;
forming an epitaxial layer over the semiconductor substrate including over the thermally grown oxide within the opening; and
forming shallow trench isolation regions in the epitaxial layer.

21. The method of claim 20, further comprising:
forming a deep well region of n-type conductivity in the epitaxial layer;
forming a deep collector region of n-type conductivity in the epitaxial layer and in contact with the buried layer;
forming a shallow well region of p-type conductivity in the deep well region;
forming a collector region of n-type conductivity in the deep collector region; and forming base and emitter regions of n-type conductivity in the shallow well region.

22. The method of claim 21, wherein the deep collector region is isolated from the shallow well region by one of the shallow trench isolation regions.

23. The method of claim 22, wherein selectively etching the oxide mask layer comprises a wet etch.

24. The method of claim 22, wherein implanting the dopant comprises implanting antimony with a dose of 3.0E15 atoms/cm$^2$ and with an energy of 60 KeV.

25. The method of claim 22, wherein performing the thermal process comprises annealing at a temperature of about 1200 degrees Celsius with an oxygen flow rate of about 0.3 percent for about 80 minutes.

26. The method of claim 22, wherein forming the oxide mask layer comprises forming the oxide mask layer with a thickness of silicon dioxide of about 1300 Angstroms; and removing the upper portion of the oxide mask layer reduces the thickness of the silicon dioxide to a thickness of about 500 Angstroms.

27. The method of claim 22, wherein forming the shallow trench isolation regions comprises:
- depositing a pad oxide and nitride layer over the epitaxial layer;
- selectively etching trenches into the epitaxial layer through the nitride layer;
- selectively filling the trenches with an oxide fill material;
- performing a planarization process to remove excess fill material; and
- removing the nitride layer.

* * * * *